United States Patent
Kreupl et al.

(10) Patent No.: US 7,425,487 B2
(45) Date of Patent: Sep. 16, 2008

(54) METHOD FOR FABRICATING A NANOELEMENT FIELD EFFECT TRANSISTOR WITH SURROUNDED GATE STRUCTURE

(75) Inventors: Franz Kreupl, Munich (DE); Robert Seidel, Dresden (DE)

(73) Assignee: Qimonda AG, Munich (DE)

( * ) Notice: Subject to any disclaimer, the term of this patent is extended or adjusted under 35 U.S.C. 154(b) by 192 days.

(21) Appl. No.: 11/482,493

(22) Filed: Jul. 7, 2006

(65) Prior Publication Data

US 2006/0261419 A1    Nov. 23, 2006

Related U.S. Application Data

(63) Continuation of application No. PCT/DE2005/000001, filed on Jan. 3, 2005.

(30) Foreign Application Priority Data

Jan. 8, 2004   (DE) .............. 10 2004 001 340

(51) Int. Cl.
H01L 21/336 (2006.01)
(52) U.S. Cl. ............... 438/284; 438/300; 977/762; 977/813
(58) Field of Classification Search ........... 438/284, 438/300; 977/720, 723, 742, 762, 813
See application file for complete search history.

(56) References Cited

U.S. PATENT DOCUMENTS

| 7,233,041 | B2 * | 6/2007 | Duan et al. ............ 257/296 |
| 2002/0117659 | A1 | 8/2002 | Lieber et al. |
| 2002/0163079 | A1 | 11/2002 | Awano |

(Continued)

FOREIGN PATENT DOCUMENTS

| DE | 42 35 152 A1 | 4/1994 |
| GB | 2 382 718 A | 6/2003 |

OTHER PUBLICATIONS

Zhou, C., et al., Modulated Chemical Doping of Individual Carbon Nanotubes, Science, vol. 290, No. 5496, Nov. 24, 2000, abstract only, 1 page.

(Continued)

*Primary Examiner*—Fernando L Toledo
(74) *Attorney, Agent, or Firm*—Slater & Matsil, L.L.P.

(57) ABSTRACT

The invention relates to a method for the production of a nanoelement field effect transistor, a nanoelement field effect transistor and a nanoelement arrangement. According to the method for the production of a nanoelement field effect transistor, a nanoelement is formed, a first and a second source-/drain area is coupled to the nanoelement, a surface area of a substrate is removed, such that a region of the nanoelement is exposed, and a gate-insulating structure and a gate structure are formed in a covered manner fully encompassing the nanoelement.

22 Claims, 2 Drawing Sheets

U.S. PATENT DOCUMENTS

2003/0178617 A1 9/2003 Appenzeller et al.
2006/0237537 A1* 10/2006 Empedocles et al. ........ 235/439
2006/0252276 A1* 11/2006 Choi et al. .................. 438/775
2006/0263255 A1* 11/2006 Han et al. .................... 422/83

OTHER PUBLICATIONS

Harris, Peter J.F., "Carbon Nanotubes and Related Structures," Cambridge University Press, 1999, 68 pages.

Javey, A., et al., "High-$_\kappa$ dielectrics for advanced carbon-nanotube transistors and logic gates," Nature Materials, Nov. 17, 2002, abstract only, 2 pages.

Maultzsch, J., et al., "Raman characterization of boron-doped multiwalled carbon nanotubes," Applied Physics Letters, vol. 81, No. 14, Sep. 30, 2002, pp. 2647-2649.

Caymax, M, et al., "High-k materials for advanced gate stack dielectrics: a comparison of ALCVD and MOCVD as deposition technologies," Mat. Res. Soc. Symp. Proc., vol. 765, 2003 Materials Research Society, pp. D2.6.1-D2.6.12.

* cited by examiner

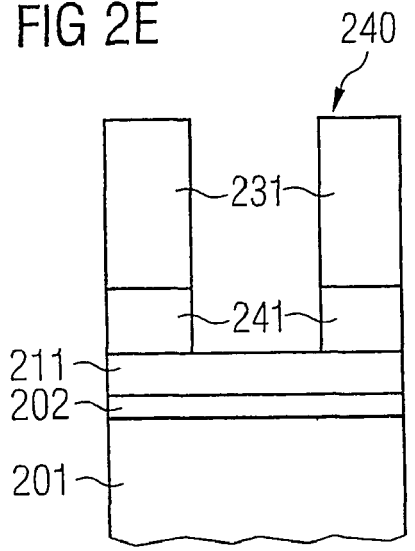
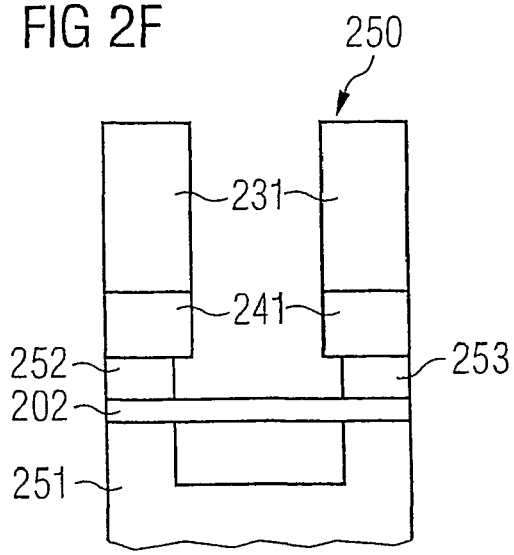
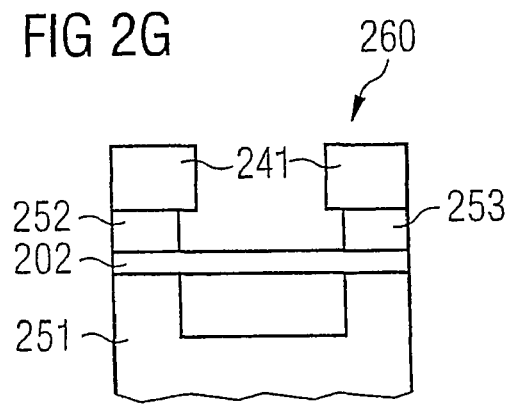
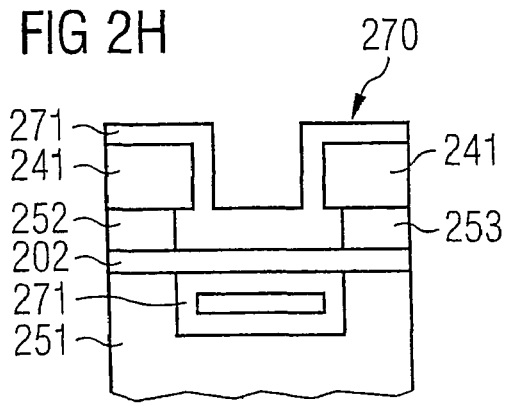
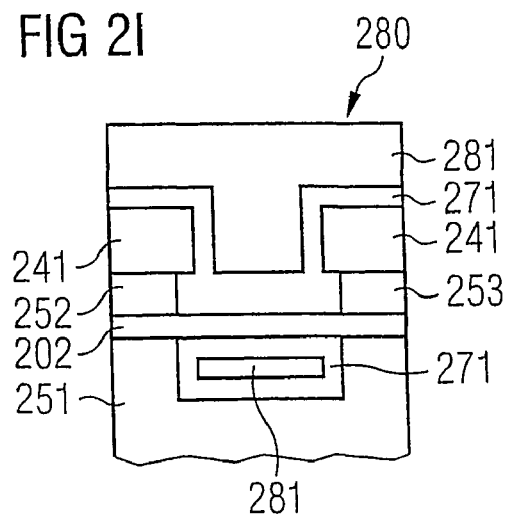

METHOD FOR FABRICATING A NANOELEMENT FIELD EFFECT TRANSISTOR WITH SURROUNDED GATE STRUCTURE

This application is a continuation of co-pending International Application No. PCT/DE2005/0000001, filed Jan. 3, 2005, which designated the United States and was not published in English, and which is based on German Application No. 10 2004 001 340.3 filed Jan. 8, 2004, both of which applications are incorporated herein by reference.

TECHNICAL FIELD

The invention relates to a method for fabricating a nanoelement field effect transistor, to a nanoelement field effect transistor and to a nanoelement array.

BACKGROUND

As miniaturization progresses, conventional silicon microelectronics will reach its limits. In particular, the development of ever smaller and densely arranged transistors, nowadays amounting to several hundred millions of transistors per chip, will be subject to fundamental physical problems and restrictions within the next ten years. When feature sizes drop below approximately 80 nm, the components are disruptively affected by quantum effects, and these effects dominate at dimensions below approximately 30 nm. The increase in integration density of components on a chip also leads to a dramatic increase in the waste heat.

Nanostructures, such as for example nanotubes, in particular carbon nanotubes, and nanorods, also known as nanowires, are known to be a possible successor technology to conventional semiconductor electronics.

By way of example, the paper by PJF Harris, "Carbon Nanotubes and Related Structures—New Materials for the Twenty-first Century," Cambridge University Press, Cambridge, pp. 1-15, 111-155, 1999, which is incorporated herein by reference, provides an overview of carbon nanotube technology. A carbon nanotube is a single-wall or multiwall, tubular carbon compound. In the case of multiwall nanotubes, at least one inner nanotube is coaxially surrounded by an outer nanotube. Single-wall nanotubes typically have a diameter of one nanometer, while the length of a nanotube may amount to several hundred micrometers. The ends of a nanotube are often terminated with, in each case, half a fullerene molecule.

Field effect transistors are required for many integrated circuits used in silicon microelectronics. A carbon nanotube can be used to form a field effect transistor of this type, resulting in the formation of what is known as a CNT-FET ("carbon nanotube field effect transistor").

As an alternative to nanotubes, in particular to carbon nanotubes, nanorods, also known as nanowires, are used as nanostructures for an integrated circuit.

One problem with integrated circuit components based on nanoelements according to the prior art is that the controlled formation and driving of nanoelement components of this type is difficult.

Furthermore, German Patent Application No. 42 35 152 C2, which is incorporated herein by reference, describes an array of free-standing silicon columns, which are used to form vertical field effect transistors, the individual silicon columns being surrounded by means of a gate oxide, and the gate oxide in turn being surrounded by the gate material polysilicon.

U.S. Patent Application Publication No. 2002/0117659 A1, which is incorporated herein by reference, discloses a chemical sensor, formed from a single nanotube, the periphery of which is covered with a silicon oxide, which is in turn surrounded by fine gate material that has been functionalized with a view to the desired chemical reaction that is to be detected. The nanotube is provided as a free nanotube without adjoining substrate, and only electrical connections provided as source region and drain region of the field effect transistor formed are illustrated at the respective longitudinal ends of the nanotube.

The paper by J. Maultzsch, et al., "Raman characterization of boron-doped multiwalled carbon nanotubes," Applied Physics Letters, Vol. 81, No. 14, pp. 2647-2649, 2002, which is incorporated herein by reference, describes properties of boron-doped multiwall carbon nanotubes.

SUMMARY OF THE INVENTION

The invention is based in particular on the problem of providing a nanoelement field effect transistor that can be fabricated in a defined way and can be successfully controlled.

In the method according to the invention for fabricating a nanoelement field effect transistor, a nanoelement is applied to a substrate. A first source/drain region is formed on and/or in the substrate and coupled to a first end portion of the nanoelement. A second source/drain region is formed on and/or in the substrate and coupled to a second end portion of the nanoelement. Furthermore, a surface region of the substrate is removed in such a manner that a region of the nanoelement, which is arranged between the first and second end potions, is uncovered over the entire periphery of the nanoelement. A gate structure is formed so as to cover the entire exposed, i.e., uncovered, periphery of the nanoelement. Furthermore, a gate structure is formed so as to cover the entire periphery of the gate insulating structure.

The nanoelement field effect transistor according to the invention includes a substrate, a nanoelement on the substrate, as well as a first source/drain region on and/or in the substrate, which is coupled to the first end portion of the nanoelement. A second source/drain region on and/or in the substrate is coupled to a second end portion of the nanoelement. A surface region of the substrate is removed in such a manner that a region of the nanoelement arranged between the first and second end portions is uncovered over the entire periphery of the nanoelement. A gate insulating structure is provided so as to cover the whole of the uncovered periphery of the nanoelement. Furthermore, a gate structure is provided, covering the entire periphery of the gate insulating structure.

The invention also provides a nanoelement array having a plurality of nanoelement field effect transistors having the abovementioned features.

One basic idea of the invention is that of removing a surface region of a substrate after the formation of a planar nanoelement, in such a manner that a region of the nanoelement is uncovered over its entire periphery. This uncovered region is covered over its entire periphery with a gate-insulating structure, and the latter is in turn covered over its entire periphery with a gate structure, thereby creating a gate region that surrounds the entire periphery of the nanoelement. This allows particularly sensitive control of the electrical conductivity of the channel region of the nanoelement field effect transistor, which channel region is formed by the nanoelement region between the two end portions coupled to the source/drain regions.

A nanoelement field effect transistor according to the invention having a surrounding gate has an improved performance and can be fabricated reproducibly. In other words, an optimized gate structure is created by virtue of the fact that the nanoelement is uniformly covered with a gate dielectric and a gate metal in a concentric way. A surrounding gate is advantageous in particular in the case of a bundle of nanoelements, for the purpose of improving the modulation of the individual nanoelements (nanotubes or nanowires) in the bundle.

The prior art has not disclosed nanoelement field effect transistors with a surrounding gate fabricated in accordance with the invention. Rather, the prior art involves forming gate dielectric and gate material on a nanoelement after deposition of the nanoelement, so that only a planar gate arrangement is obtained. Compared to this approach, the invention has the advantage that the capacitance of the gate region does not vary in a peripheral direction around the nanoelement. On account of the coaxial gate arrangement, it is possible to realize a higher gate capacitance, which leads to improved performance of the transistor. This allows a deterioration in the modulation of the conductive channel in the nanoelement, which occurs in the prior art, to be avoided, and allows the nanoelement field effect transistor to be operated in particular at high operating frequencies.

One important aspect of the invention is the formation of nanoelements (for example suspended or formed on a substrate) between a source contact and a drain contact and the covering of the nanotube with a gate dielectric and a gate metal over the entire periphery, for example based on a deposition process from the liquid phase or vapor phase. The advantage of the solution according to the invention is that after the nanoelements have been fabricated, they can be covered uniformly with a dielectric layer over the entire periphery of the nanoelement, thereby creating a surrounding gate.

The nanoelement is preferably arranged on the substrate in such a manner that the flow of electric charge carriers through the nanoelement is substantially parallel to the main processing surface of the substrate. In the method for fabricating a nanoelement field effect transistor, to form the first and second source/drain regions an electrically conductive region can be formed on the nanoelement and patterned. In other words, an areal layer of an electrically conductive material can be deposited on the substrate with nanotube arranged thereon and can be patterned to form the first and second source/drain regions using for example a lithography process and an etching process.

A common mask can be used to pattern the electrically conductive region and to remove the surface region of the substrate. The number of masks is one of the main cost aspects in a semiconductor technology fabrication method. Since, according to the refinement of the invention described, the patterning of the source/drain regions and the removal of a surface region of the substrate to uncover a central region of the nanoelement are realized using one common mask, it is possible to save one mask, allowing the nanoelement field effect transistor to be fabricated at reduced cost.

An electrically insulating structure for electrically decoupling the first source/drain region and the second source/drain region from the gate structure may be formed on the first source/drain region and on the second source/drain region. If, according to this configuration, the two source/drain regions are surrounded with an electrically insulating structure, an undesirable electrical short circuit between source/drain regions and the gate region is avoided during subsequent deposition of the gate region.

The electrically insulating structure can be used as a mask for patterning the electrically conductive region and for removing the surface region of the substrate. Also according to this configuration, it is possible to achieve fabrication of the nanoelement field effect transistor, which is simple in terms of process engineering, since the costs involved in the masking steps are reduced.

The patterning of the electrically conductive region and the removal of the surface region of the substrate can be carried out by means of undercut etching of the electrically insulating structure. Undercut etching of the electrically insulating structure of this type leads to a particularly large area of the nanoelement being uncovered, thereby allowing driving along a large subregion of the nanoelement. This additionally increases the sensitivity of the surrounding-gate field effect transistor, which is in any case already highly sensitive. Therefore, this configuration allows particularly sensitive driving of the nanoelement field effect transistor.

The gate-insulating structure may be formed as a ring structure surrounding the nanoelement. Furthermore, the gate structure may be formed as a ring structure surrounding the gate-insulating structure. Particularly sensitive driving of the nanoelement field effect transistor is in turn made possible by means of such a ring-like gate structure or the structure of the gate-insulating layer.

The gate structure and/or the gate-insulating structure can be formed using an atomic layer deposition process (ALD process). With an ALD process, it is possible to form a structure of an accurately predeterminable thickness on another structure with a high degree of selectivity. The ALD process allows particularly uniform covering of a structure with an accurately adjustable thickness, which thickness can be predetermined up to the accuracy of one atomic layer (i.e., to within an accuracy of a few Angstrom). The homogenous coverage of the nanoelement with electrically insulating material to form the gate-insulating structure allows highly accurate geometric setting of the properties of the nanoelement field-effect transistor, which can therefore be fabricated with good reproducibility. As an alternative to the ALD process, it is possible, for example, to use any other desired CVD (chemical vapor deposition) process.

The removed surface region of the substrate can be completely or partially filled with the gate-insulating structure and with the gate structure. According to this configuration, material-free regions, which may be mechanically unstable, in the semiconductor technology product obtained are reduced or avoided, resulting in a good quality being achieved.

The nanoelement can first of all be completely fabricated and then applied to the substrate. According to this configuration, the nanoelements can first of all be completely fabricated and can then be dissolved or resuspended in a liquid. A liquid of this type can then be applied to a substrate by means of a spinning process or a spraying process, thereby allowing the nanoelement to be applied to the substrate. Alternatively, it is possible to use Langmuir-Blodgett film techniques to apply fully fabricated carbon nanotubes to the substrate.

Alternatively, the nanoelement can be grown on the substrate. In the case of direct growth of the nanoelement on the substrate, by way of example it is possible to carry out catalytic growth (suitable catalyst materials for carbon nanotubes include for example iron, cobalt or nickel) in a CVD (chemical vapor deposition) apparatus. The growth of the carbon nanotubes on a catalyst-material layer can be realized, for example, by introducing one or a combination of the materials acetylene, methane, ethane, ethyne, alcohols and/or acetone into the process chamber.

The text that follows provides a more detailed description of the nanoelement field effect transistor according to the invention. Configurations of the method for fabricating the nanoelement field effect transistor also apply to the nanoelement field effect transistor and vice versa.

The gate-insulating structure may, for example, include silicon oxide, silicon nitride, aluminum oxide, titanium oxide, tantalum oxide, zirconium oxide and/or hafnium oxide.

The gate structure may include molybdenum, tantalum, nickel, cobalt, titanium nitride, tantalum nitride, carbon, tungsten and/or polysilicon.

The nanoelement may, for example, be a nanotube, a bundle of nanotubes or a nanorod. In particular, the nanoelement may be formed from any material with semiconducting properties that has a sufficiently high length to diameter ratio (aspect ratio), the diameter of the nanoelement typically being in the nanometer range (for example carbon nanotubes, boron nitride nanotubes, nanowires).

In particular, a nanoelement formed as a nanorod may include silicon, germanium, indium phosphide, gallium nitride, gallium arsenide, cadmium selenide, zirconium oxide, at least one of the III-V semiconductors BN, BP, BAs, AlN, AlP, AlAs, AlSb, GaN, GaP, GaAs, GaSb, InN, InP, InAs, InSb, at least one of the II-VI semiconductors ZnO, ZnS, ZnSe, ZnTe, CdS, CdSe, CdTe, HgS, HgSe, HgTe, BeS, BeSe, BeTe, MgS, MgSe, at least one of the compounds GeS, GeSe, GeTe, SnS, SnSe, SnTe, PbO, PbS, PbSe, PbTe, at least one of the compounds CuF, CuCl, CuBr, CuI, AgF, AgCl, AgBr, AgI and/or a metal.

In the nanoelement field effect transistor, the nanorod may be p-doped or n-doped.

A nanoelement realized as a nanotube may be a carbon nanotube, a carbon-boron nanotube, a carbon-nitrogen nanotube, a tungsten sulphide nano structure or a chalcogenide nanotube.

In the nanoelement field effect transistor, the nanotube may be p-doped or n-doped.

Suitable substrate materials are preferably all dielectric materials that can be etched with sufficient selectivity with respect to the material of the source and drain electrodes and with respect to the nanoelement.

It should also be noted that the source/drain regions may either be formed as components provided separately from the nanoelement or alternatively may be realized as doped end portions of the nanoelement. In the latter case, the nanoelement is a heterostructure nanoelement with end portions of good conductivity as first and second source/drain regions and a less highly doped central region arranged between them as the channel region.

BRIEF DESCRIPTION OF THE DRAWINGS

Exemplary embodiments of the invention are illustrated in the figures and explained in more detail in the text that follows. In the figures:

FIGS. 2A to 2I show layer sequences at different times during a method for fabricating a silicon nanorod field effect transistor in accordance with a preferred exemplary embodiment of the invention.

Identical or similar components in different figures are provided with the same reference numerals.

Figure 1:
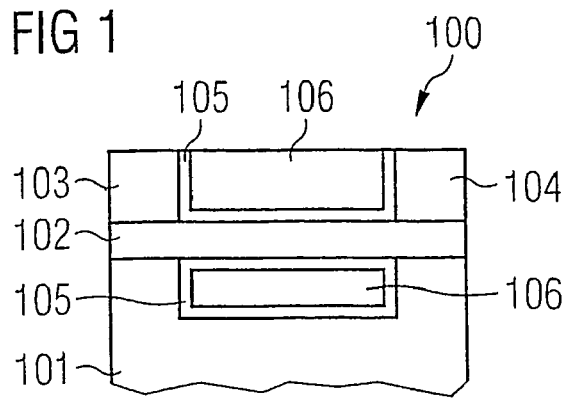
FIG. 1 shows a carbon nanotube field effect transistor according to a preferred exemplary embodiment of the invention.

The illustrations in the figures are schematic and not to scale.

The following list of reference symbols can be used in conjunction with the figures:
100 Carbon nanotube field effect transistor
101 Silicon oxide substrate
102 Carbon nanotube
103 First source/drain region
104 Second source/drain region
105 Gate-insulating ring structure
106 Gate ring structure
200 Layer sequence
201 Silicon oxide substrate
202 Silicon nanorod
210 Layer sequence
211 Metal layer
212 Silicon nitride layer
220 Layer sequence
221 Photoresist layer
230 Layer sequence
231 Patterned photoresist layer
240 Layer sequence
241 Patterned silicon nitride layer
250 Layer sequence
251 Patterned substrate
252 First source/drain region
253 Second source/drain region
260 Layer sequence
270 Layer sequence
271 Gate-insulating ring structure
280 Silicon nanorod field effect transistor
281 Gate electrode

DETAILED DESCRIPTION OF ILLUSTRATIVE EMBODIMENTS

The text that follows, referring to FIG. 1, provides a description of a carbon nanotube field effect transistor 100 in accordance with a preferred exemplary embodiment of the invention.

The carbon nanotube field effect transistor 100 has a silicon oxide substrate 101 and a carbon nanotube 102 formed on the silicon oxide substrate 101. A first end portion of the carbon nanotube 102 is formed with a first source/drain region 103 of metallic material, such as for example palladium, titanium, gold, cobalt, tantalum, tungsten or molybdenum, on the silicon oxide substrate 101. Furthermore, a second source/drain region 104 of metallic material, such as for example palladium, titanium, gold, cobalt, tantalum, tungsten or molybdenum, is formed on the silicon oxide substrate 101, which second source/drain region 104 is coupled to a second end portion of the carbon nanotube 102. A removed surface region of the silicon oxide substrate 101, which has been removed below a central portion of the carbon nanotube 102, is filled with material of a gate-insulating ring structure 105 and a gate ring structure 106.

The carbon nanotube 102 is covered over its entire periphery with the gate-insulating ring structure 105 of silicon oxide material. The gate-insulating ring structure 105 has been formed by means of an ALD (atomic layer deposition) process, so that a silicon oxide layer of a homogenous thickness covers uncovered regions of the source/drain regions 103, 104, the central portion of the carbon nanotube 102 and uncovered surface regions of the silicon oxide substrate 101. After the gate-insulating ring structure 105 has been formed, a gate ring structure 106 of tungsten material is formed, surrounding the entire periphery of both the gate-insulating ring structure 105 and the central region of the carbon nanotube 102. In other words, the cylinder-like carbon nanotube 102, or in general terms the nanoelement, is radially and concentrically surrounded by two structures 105, 106 in hollow cylinder form.

On account of the semiconducting carbon nanotube 102 being surrounded by the control gate electrode 106 over its entire periphery, with the control gate electrode 106 electrically decoupled from the carbon nanotube 102 by the gate-insulating ring structure 105, the field effect allows very selective drivability of the electrical conductivity of the central region of the carbon nanotube 102 as channel region of the carbon nanotube field effect transistor 100.

Therefore, the channel region of the carbon nanotube 102 either conducts well or is approximately electrically insulating depending on whether or not an electrical control voltage is applied to the gate ring structure 106. The result is a field effect transistor based on a carbon nanotube 102 that can be driven particularly accurately. This transistor can be used, for example, as a switching element in an integrated circuit or as the basis for a memory cell.

The following text, referring to FIG. 2A to FIG. 2I, describes a process for producing a silicon nanotube field effect transistor 280 in accordance with a preferred exemplary embodiment of the invention.

Figure 2A:
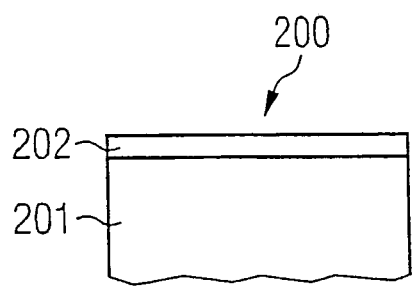

To obtain the layer sequence 200 shown in FIG. 2A, a semiconducting silicon nanorod 202 is formed on a silicon oxide substrate 201, for example using a CVD process.

Figure 2B:
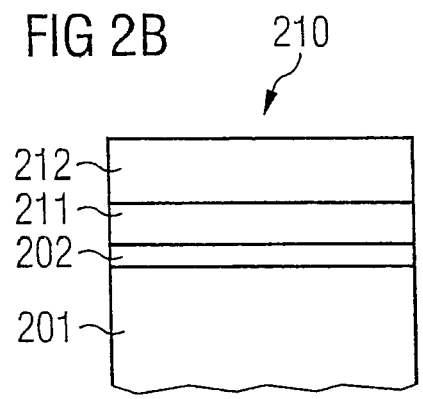

To obtain the layer sequence 210 shown in FIG. 2B, a metal layer 211 and then a silicon nitride layer 212 are formed on the layer sequence 200. The metal layer 211 can be formed, for example, by means of electron beam evaporation or a sputtering process. The optional dielectric layer 212 has the function of a field oxide layer. In a subsequent process step, the source/drain contacts are formed from the metal layer 211.

Figure 2C:
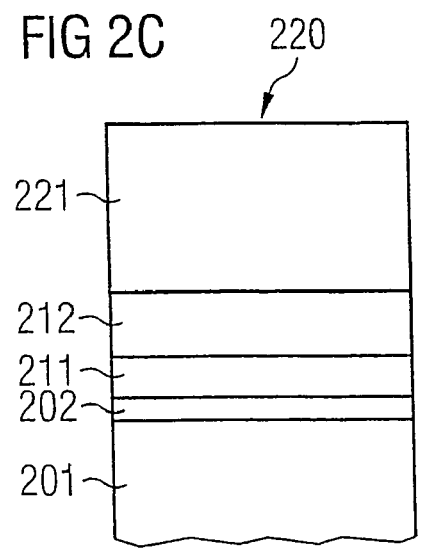

To obtain the layer sequence 220 shown in FIG. 2C, a photoresist layer 221 is formed on the surface of the layer sequence 210.

Figure 2D:
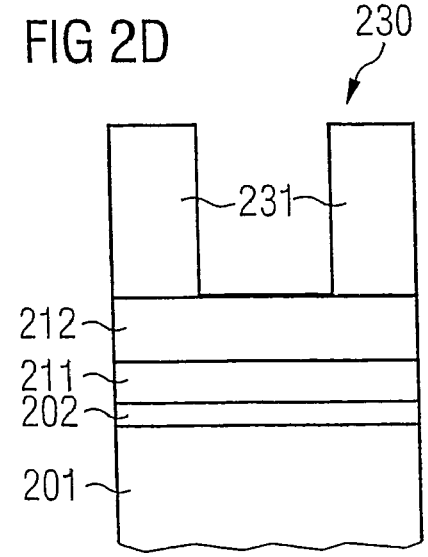

To obtain the layer sequence 230 shown in FIG. 2D, the photoresist layer 221 is patterned using a lithography process and an etching process, resulting in the formation of a patterned photoresist layer 231 and in a surface region of the silicon nitride layer 212 being uncovered.

To obtain the layer sequence 240 shown in FIG. 2E, the silicon nitride layer 212 is patterned using the patterned photoresist layer 231 as a mask, resulting in the formation of a patterned silicon nitride layer 241 and in a surface region of the metal layer 211 being uncovered.

To obtain the layer sequence 250 shown in FIG. 2F, the metal layer 211 is patterned, using the patterned photoresist layer 231 and the patterned silicon nitride layer 241 as mask, in such a manner that a first source/drain region 252 and a second source/drain region 253, which is electrically decoupled from the first source/drain region 252, are formed. The first source/drain region 252 is coupled to a first end portion of the silicon nanorod 202, whereas the second source/drain region 253 is coupled to a second end portion of the silicon nanorod 202. The central region of the silicon nanorod 202 is uncovered by the etching process, since on account of the etching process used the silicon oxide substrate 201 is also patterned in such a manner that a patterned silicon oxide substrate 251 with a trench region at its surface is generated. The etching process is selected in such a manner that etching of the silicon nanorod 202 is avoided, in order to avoid undesirable removal of the silicon nanorod 202 (selective etching process).

The patterning of the source/drain metallization layer 211 and the removal of material of the substrate 201 so as to uncover the silicon nanorod 202 is realized using a physical or chemical etching process. The etching process has a sufficient selectivity, so that damage to the silicon nanorod 202 is avoided.

The etching process involves undercut etching of the metal layer 211 and of the silicon oxide substrate 201 in the horizontal direction in accordance with FIG. 2F. The etching process may be a wet chemical etching process, which in terms of process engineering is controlled in such a manner that the silicon nanotube 202 is protected from being removed as a result of the etching and after the etching process has ended lies freely in the air.

To obtain the layer sequence 260 shown in FIG. 2G, the photoresist 231 is removed.

To obtain the layer sequence 270 shown in FIG. 2H, a gate-insulating ring structure 271 is deposited using an atomic layer deposition process (ALD process). During the ALD process, all the uncovered surface regions of the layer sequence 260 are provided with a uniformly thick layer of the gate-insulating ring structure 271. In particular, the silicon nanorod 202 is surrounded over its entire periphery by the gate-insulating ring structure 271, which in a central region of the silicon nanorod 202 surrounds the cylindrical silicon nanorod 202 in the form of a hollow cylinder. Furthermore, uncovered surface regions of the patterned substrate 251, of the first and second source/drain regions 252, 253 and of the patterned silicon nitride layer 241 are surrounded by a layer of the gate-insulating ring structure 271 having a fixedly predetermined thickness. Therefore, the gate-insulating ring structure 271 simultaneously forms an electrically insulating sealing, with the result that in particular the source/drain regions 252, 253 are reliably electrically decoupled from their surroundings.

As an alternative to the ALD process, it is also possible to use another suitable CVD process, etc. However, the ALD process is the preferred choice in order to achieve uniform coverage with the gate dielectric.

To obtain the silicon nanorod field effect transistor 280 shown in FIG. 2I, the layer sequence 270 is covered with electrically conductive material to form a gate electrode 281. As a result, voids in the trench present in the substrate 251 are filled. The gate electrode 281 surrounds the gate-insulating ring structure 271 along its entire periphery, thereby forming a surrounding gate.

Furthermore, material of the gate electrode 281 is provided in an upper region, as shown in FIG. 2I, of the silicon nanorod field effect transistor 280, which gate electrode material is coupled to an electrical driving circuit (not shown in FIG. 2I), by means of which a control voltage can be applied to the gate electrode 281 in order to drive the silicon nanorod 202 as the channel region of the silicon nanorod field effect transistor 280.

The deposition of the gate electrode 281 can be carried out, for example, using a CVD process (ALD process, metalorganic epitaxy MOCVD, autopyrolytic reactions, etc.).

On account of the uncovered region of the silicon nanorod 202 being surrounded by the gate-insulating ring structure 271 and the gate structure 281, a particularly sensitive field effect can be achieved, with the gate not acting in planar fashion but rather being provided so as to completely surround the silicon nanorod 202. The result is a lateral surrounding-gate field effect transistor 280.

What is claimed is:

1. A method for fabricating a nanoelement field effect transistor, the method comprising:
applying a nanoelement to a substrate;
forming a first source/drain region on and/or in the substrate, the first source/drain region being coupled to a first end portion of the nanoelement;
forming a second source/drain region on and/or in the substrate, the second source/drain region being coupled to a second end portion of the nanoelement;
removing a surface region of the substrate in such a manner that a region of the nanoelement arranged between the first and second end portions is uncovered over the entire periphery of the nanoelement;
forming a gate-insulating structure so as to cover the whole of the uncovered periphery of the nanoelement; and
forming a gate structure so as to cover the entire periphery of the gate-insulating structure.

2. The method as claimed in claim 1, wherein forming the first and second source/drain regions comprises forming an electrically conductive region on the nanoelement and/or on the substrate and patterning the electrically conductive region.

3. The method as claimed in claim 2, wherein patterning the electrically conductive region comprises using a common mask for the patterning of the electrically conductive region and for the removal of the surface region of the substrate.

4. The method as claimed in claim 1, further comprising forming an electrically insulating structure over the first and second source/drain regions for the purpose of electrically decoupling the first and second source/drain regions from the gate structure.

5. The method as claimed in claim 4, wherein the electrically insulating structure is used as a mask for patterning an electrically conductive region and for removing the surface region of the substrate.

6. The method as claimed in claim 5, wherein the patterning of the electrically conductive region and the removal of the surface region of the substrate are carried out by means of undercut etching of the electrically insulating structure.

7. The method as claimed in claim 1, wherein the gate-insulating structure is formed as a ring structure surrounding the nanoelement.

8. The method as claimed in claim 1, wherein the gate structure is formed as a ring structure that surrounds the gate-insulating structure.

9. The method as claimed in claim 1, wherein the gate structure and/or the gate-insulating structure is/are formed using an atomic layer deposition process.

10. The method as claimed in claim 1, wherein the removed surface region of the substrate is completely or partially filled with the gate-insulating structure and with the gate structure.

11. The method as claimed in claim 1, wherein applying a nanoelement to a substrate comprises first completely producing the nanoelement and then applying the completely produced nanoelement to the substrate.

12. The method as claimed in claim 1, wherein applying a nanoelement comprises growing the nanoelement on the substrate.

13. The method as claimed in claim 1, wherein the nanoelement is a nanotube, a bundle of nanotubes, or a nanorod.

14. The method as claimed in claim 1, wherein the gate-insulating structure comprises silicon oxide, silicon nitride, aluminum oxide, tantalum oxide, titanium oxide, zirconium oxide, and/or hafnium oxide.

15. The method as claimed in claim 1, wherein the gate structure comprises tantalum nitride, tantalum, molybdenum, nickel, cobalt, titanium nitride, carbon, tungsten, and/or polysilicon.

16. The method as claimed in claim 1, wherein the nanoelement comprises a silicon nanorod or a germanium nanorod.

17. The method as claimed in claim 1, wherein the nanoelement comprises a nanorod, the nanorod comprising at least one of the III-V semiconductors BN, BP, BAs, AlN, AlP, AlAs, AlSb, GaN, GaP, GaAs, GaSb, InN, InP, InAs, or InSb.

18. The method as claimed in claim 1, wherein the nanoelement comprises a nanorod, the nanorod comprising at least one of the II-VI semiconductors ZnO, ZnS, ZnSe, ZnTe, CdS, CdSe, CdTe, HgS, HgSe, HgTe, BeS, BeSe, BeTe, MgS, or MgSe.

19. The method as claimed in claim 1, wherein the nanoelement comprises a nanorod, the nanorod comprising at least one of the compounds GeS, GeSe, GeTe, SnS, SnSe, SnTe, PbO, PbS, PbSe, or PbTe.

20. The method as claimed in claim 1, wherein the nanoelement comprises a nanorod, the nanorod comprising at least one of the compounds CuF, CuCl, CuBr, CuI, AgF, AgCl, AgBr, or AgI.

21. The method as claimed in claim 1, wherein the nanoelement is a carbon nanotube, a carbon-boron nanotube, a carbon-nitrogen nanotube, a tungsten sulphide nanostructure, or a chalcogenide nanotube.

22. The method as claimed in claim 1, wherein the nanoelement is p-doped.

* * * * *